United States Patent
Insenser Farre et al.

(10) Patent No.: US 6,460,172 B1
(45) Date of Patent: Oct. 1, 2002

(54) MICROPROCESSOR BASED MIXED SIGNAL FIELD PROGRAMMABLE INTEGRATED DEVICE AND PROTOTYPING METHODOLOGY

(75) Inventors: Jose Maria Insenser Farre; Julio Faura Enriquez, both of Tres Cantos-Madrid (ES)

(73) Assignee: Semiconductors Investigacion Diseno, S.A. (SIDSA), Tres Cantos Madrid (ES)

( * ) Notice: Subject to any disclaimer, the term of this patent is extended or adjusted under 35 U.S.C. 154(b) by 226 days.

(21) Appl. No.: 09/598,588

(22) Filed: Jun. 21, 2000

(51) Int. Cl.[7] .............................................. G06F 17/50
(52) U.S. Cl. ......................................... 716/17; 716/16
(58) Field of Search ........................... 716/1–5, 16–18, 716/8–10, 12; 326/37–41; 703/13–15, 23, 28

(56) References Cited

U.S. PATENT DOCUMENTS

| | | | |
|---|---|---|---|
| 4,402,044 A | * 8/1983 | McDonough et al. | 257/203 |
| 5,197,016 A |   3/1993 | Sugimoto et al. | 716/8 |
| 5,361,373 A |   11/1994 | Gilson | 712/1 |
| 5,384,275 A |   1/1995 | Sakashita | 326/38 |
| 5,402,358 A |   3/1995 | Smith et al. | 716/9 |
| 5,425,036 A |   6/1995 | Liu et al. | 714/735 |
| 5,438,681 A | * 8/1995 | Mensch, Jr. | 716/17 |
| 5,581,742 A | * 12/1996 | Lin et al. | 716/4 |
| 5,959,871 A | * 9/1999 | Pierzchala et al. | 327/565 |
| 6,006,022 A | * 12/1999 | Rhim et al. | 703/26 |
| 6,014,509 A | * 1/2000 | Furtek et al. | 716/16 |

FOREIGN PATENT DOCUMENTS

WO    WO 93/16433    8/1993

OTHER PUBLICATIONS

"FIPSOC Mixed Signal System–on–Chip", *SIDSA*, pp. 1–4.

* cited by examiner

*Primary Examiner*—Matthew Smith
*Assistant Examiner*—Paul Dinh
(74) *Attorney, Agent, or Firm*—Merchant & Gould P.C.

(57) ABSTRACT

A user-programmable integrated circuit that includes over the same silicon die a) a set of programmable logic cells such as the ones used in already reported FPGAs; b) a set of programmable mixed signal and analog cells, in particular the necessary circuitry for signal conditioning acquisition and generation, such as operational amplifiers, filters, comparators, analog-to-digital converters (ADCs) and digital-to-analog converters (DACs); c) a microprocessor used both for controlling and configuring the whole system and for running general purpose user programs; and d) optimized interfaces between these three blocks that would allow the user to read the digital signals implemented in the programmable logic array as memory locations in real time, directly interface the digital part of the analog and digital signals from the microprocessor and from the programmable logic, and configure and dynamically reconfigure all the programmable features of the system with the microprocessor, between countless other possibilities.

4 Claims, 2 Drawing Sheets

MICROPROCESSOR BASED MIXED SIGNAL FIELD PROGRAMMABLE INTEGRATED DEVICE AND PROTOTYPING METHODOLOGY

FIELD

The invention relates to integrated circuits, and more specifically to user-programmable microprocessor based mixed signal integrated circuits; it also relates to emulation tools, and especially to hardware-software on-chip co-emulation techniques.

BACKGROUND

As the complexity of electronic systems grows, it becomes more and more difficult to follow a traditional design methodology of working separately on different subsystems with different design and prototyping tools. System designers have been craving for flexible prototyping systems onto which they could map large designs to validate them before fabrication, but only microprocessor emulators and digital configurable arrays, such as FPGAs, have been available in the past. In a further step, analog programmable arrays have also appeared recently to provide fast prototyping possibilities for analog applications.

Currently mixed-signal applications are typically solved in three domains: digital hardware, analog hardware, and microprocessor programs. It is normal for a medium complexity mixed signal integrated circuit to integrate a microprocessor core to run a user program, some digital hardware for control purposes and an analog subsystem for data acquisition or analog applications. In such case, the typical designer normally follows a discrete methodology: an assembler-compiler-debugger for the microprocessor program, a design entry tool (either schematic capture or HDL) and a digital simulator for the digital hardware, and an analog simulator for the analog subsystem. The main drawback for a user of this methodology is that the design is conceived and designed separately and it turns out to be difficult to control the interfaces between these three domains. The situation is also bleak in prototyping; the best solution normally is to use a field programmable gate array (FPGA) for the digital hardware, some discrete ICs or (only recently) an analog array for the analog hardware, and a microprocessor emulator for the user program. Again, a completely different development system has to be used for each part, and special care has to be taken when designing the different interfaces.

Much effort has been put into an integrated methodology. First, the microcontrollers solved the problem of interfacing a microprocessor with typical hardware applications such as timers, ADCs, general purpose digital I/O ports, serial communication interfaces, and so forth. Furthermore, FPGA vendors have created or tried to create easy-to-use interfaces between FPGAs and microprocessors in a way that could make it possible to easily map hardware peripherals onto the microprocessor address space. On the other hand, several optimized mixed-signal simulation tools and even mixed-signal prototyping devices have also been reported.

SUMMARY

It is an object of the invention to provide a user-programmable integrated circuit that would include over the same silicon die a) a set of programmable logic cells such as the ones used in already reported FPGAs; b) a set of programmable mixed signal and analog cells, in particular the necessary circuitry for signal conditioning acquisition and generation, such as operational amplifiers, filters, comparators, analog-to-digital converters (ADCs) and digital-to-analog converters (DACs); c) a microprocessor used both for controlling and configuring the whole system and for running general purpose user programs; and d) optimized interfaces between these three blocks that would allow the user to read the digital signals implemented in the programmable logic array as memory locations in real time, directly interface the digital part of the analog and digital signals from the microprocessor and from the programmable logic, and configure and dynamically reconfigure all the programmable features of the system with the microprocessor, between countless other possibilities.

Another object of the invention is the inclusion of a multiple number of memory cells for each configuration cell to allow the programmable device switch its configuration in a very fast time to then change its functionality in part or in whole without the need of stopping the current device operation at all. A set of stored information necessary to support one configuration of the device is termed a "context."

It is also an object of the invention to provide a multi-context device capable of storing and quickly switching configurations without having to reload them or to stop the operation of the user application being running at a given moment.

Yet another object of the invention is a methodology for exploiting the integrated circuit described above; the methodology, schematically shown in FIG. 4, is an integration of all the tools used for each of the three architectures included in the chip (programmable digital hardware, programmable analog hardware, and microprocessor software), and it particularly includes an integrated emulator that links the user circuit entered with schematics and/or a Hardware Description Language (HDL) with a hardware/software co-emulation and open simulation engines, in a way that makes possible to specify and co-emulate hardware and mixed-signal (analog and digital) general purpose applications in real time over the single silicon chip.

The invention further relates to a Field Programmable System-on-a-Chip (or FIPSOC for short), a new approach to system prototyping of mixed signal applications, comprising a mixed signal device with on-chip microprocessor, suitable user-friendly CAD tools to program it and a set of library macros and applications to provide an easy path for migration to ASIC. The chip comprises a RAM based, multi-context dynamically re-configurable lookup table (LUT) section and includes large granularity logic cells targeted for synthesis programs, programmable analog blocks with configurable interconnectivity and an optimized interface to the on-chip microprocessor core. The microprocessor can read and write both the configuration and the internal signals (digital and analog) while in operation, providing a powerful workbench for real time probing, hardware-software interaction and applications based on dynamic reconfiguration (two configuration contexts are stored so the user can swap them out with a microprocessor command without having to stop the user application running over the programmable substrate). The CAD design flow includes mixed signal design specification, simulation, automatic technology mapping, device programming, and real time emulation (probing of internal signals), so the user can work at system level with microprocessor code and mixed-signal hardware using an integrated design tool. Finally, library macros are provided to support typical user applications and to provide an immediate way to migrate the application to ASIC after prototyping.

DETAILED DESCRIPTION

Figure 1:
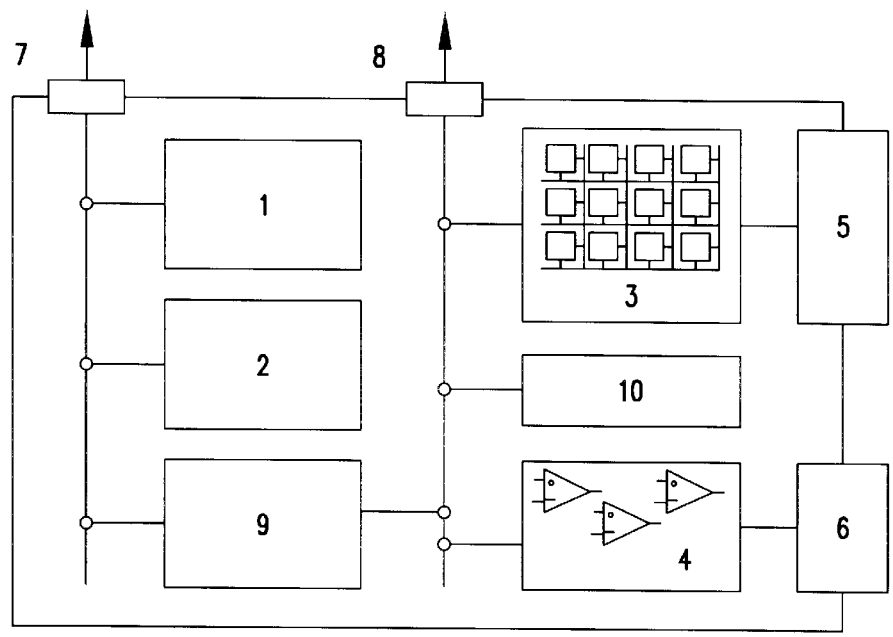
FIG. 1 shows a general block diagram of the FIPSOC architecture of the invention.

As shown in FIG. 1, the FIPSOC architecture includes a microcontroller 2, RAM memory 1 for data and programs, a set of programmable digital cells 3 as in an FPGA, a set of programmable analog cells 4, a set of programmable digital input/output cells 5, a set of programmable analog input/output pads 6, an interface 7 to interconnect the internal memory bus to external devices, and an external interface 8 to communicate the device with other FIPSOC devices through a fast serial link, and an optimized interface 9 to interconnect the microprocessor core to the programmable cells and other on-chip peripherals 10.

Figure 2:
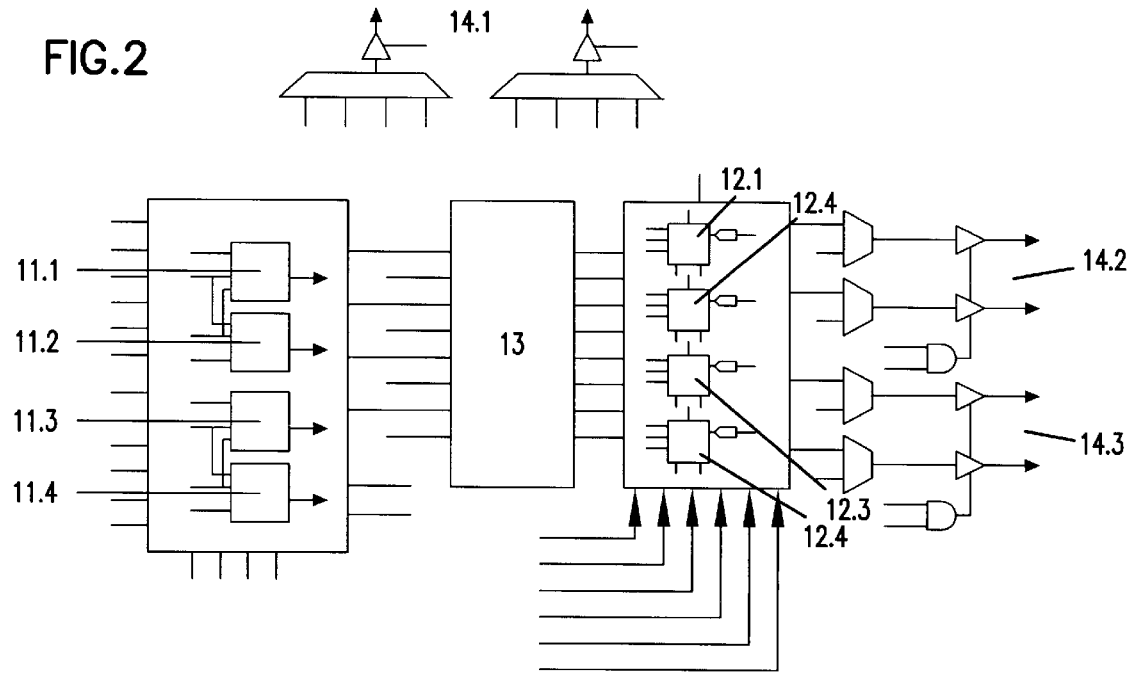
FIG. 2 depicts the proposed structure for the Digital Macro Cell (DMC) to be used in the programmable array.

As shown in FIG. 2, the DMC includes four configurable LUTs 11.1 to 11.4, four programmable flip-flops 12.1 to 12.4, an internal router 13 to interconnect them and an external interface 14.1 to 14.3 to interconnect the DMC outputs to the routing channels.

The invention, which can be characterized as a Field Programmable System On a Chip (FIPSOC), comprises a mixed-signal field programmable device (FPD) with a standard microprocessor core, a suitable set of CAD tools to easily program it, and a set of library macros and cells which support a number of typical applications to be easily mapped onto the FPD and migrated to an ASIC afterwards, if required. The interaction between each of the three domains is as close as it can be: the microprocessor can read and write the configuration of the analog and digital hardware and can physically interface ports and the entire microprocessor bus to the routing channels of the FPD). Any point inside the digital blocks or the analog subsystems can be probed and it can even change the data inside the FFs of the digital cells real time. The microprocessor is then used to configure (and reconfigure) the programmable cells, to interact with the actual hardware are mapped onto them and to run general purpose user programs.

The "new concept" of this approach relies upon the fully integrated design and prototyping methodology that the user can follow with such a system. A powerful set of user-friendly CAD tools is provided, with the final target of letting the user specify, compile, simulate, emulate (probe) and map the complete design on a single chip using one design environment. This includes mixed-signal schematic capture 15 and simulation 16, software compilation 23, automatic technology mapping 17, placement 18 and routing tools 19, an integrated emulation software 20 (which allows step by step program execution and real time internal signal probing), and an integrated device programming package 21.1 and 21.2.

A large set of library macros provides optimized solutions to typical design needs, albeit the user can implement his own ones at any design level, from HDL to even manual placement and routing. A parallel ASIC library is also supported to make the migration to ASIC much easier than in normal prototyping solutions.

As an added value, two configuration contexts are stored, which makes it possible to change the configuration of the whole circuit (or part of it) with a microprocessor command. This feature, and the close interaction between the microprocessor and the programmable digital cells, makes this FPD a powerful tool for applications based on hardware-software interaction and dynamic reconfiguration.

The design of the chip is accomplished in a modular manner to allow the derivation of a family of FIPSOC devices with a range of sizes and organizations to fit user designs of different levels of complexity. Typical levels of complexity for the initial prototypes of this family are situated around 10K usable logic gates, 10 to 12 bits accuracy for the mixed signal block, and a microcontroller.

FIG. 1 schematically shows a block diagram of the FIPSOC device. The digital configurable hardware 3 is an array of programmable DMCs (Digital Macro Cell). The DMC is a large granularity, LUT based, synthesis targeted 4-bit wide programmable cell. FIG. 2 shows a simplified block diagram of the DMC.

Each lookup table (LUT) 11.1 to 11.4 can implement any Boolean function of 4 inputs, and two LUTs can be combined to form a 5 input function. The four LUTs of a DMC can be combined to perform any 6 input Boolean function. Four flip-flops (FF) are available within every DMC 12.1 to 12.4, and each one can be independently configured as mux-type or enable and latch or FF, and with synchronous and asynchronous set or reset. Both parts (combinational and sequential) of the DMC can be used more or less independently. There also are a number of macro modes which can configure the DMC as a 16×4 memory (in fact, two independent 16×2 memories), a cascadable 4-bit adder with carry-in and carry-out, a cascadable shift register with load and enable, and a cascadable 4-bit up/down counter with load and enable. These macro functions are especially suitable to be used by synthesis programs.

The analog subsystem 4 is composed of fixed functionality blocks of coarse granularity. The analog functions include user programmable amplifiers, filters, analog multiplexers, comparators, voltage references, 10–12 bits ACD/DACs, etc. Several parameters can be configured from the microprocessor, such as the operating frequency of the filters, the gain and offset of the amplifiers, the function of the ADC/DAC block (as a DAC or as an ADC), etc. A flexible interconnection architecture is provided to let the user build a custom application out of these blocks. Furthermore, having dedicated hardware for each analog function allows an easy path for migration to ASIC, as the same cells used in the prototype can be used in the final ASIC design should volume subsequently justify it.

An optimized serial link is provided to communicate the microprocessor core with the digital and analog hardware. The configuration is read and written using this interface, and the actual signals at the outputs of the DMCs can be accessed by the microprocessor too. The ADC can also be triggered using this interface, so it is possible to use it from the microprocessor without wasting configurable hardware resources (DMCs and routing channels) to map the ADC onto the microprocessor address space.

Finally, a simple serial interface to the chip outside (an on-chip peripheral 10) can be used to power up the system from a PC, so a complete development system can be implemented using only the FIPSOC chip, the PC and a RS232 interface between them.

Figure 3:
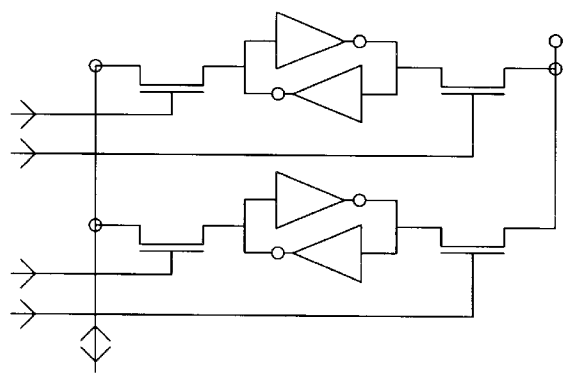
FIG. 3 shows a scheme of the proposed multi-context configuration structure, which includes two memory bits from which the actual information for each configurable feature can be selected.

As it has been already mentioned, two configuration contexts are stored for every programmable feature of the FIPSOC chip. In fact, every configuration bit is backed-up by a two bit memory cell as schematically shown in FIG. 3.

The microprocessor can then read and write any of these memory locations while in operation. This allows the user to reconfigure a context while the other one is still active, then changing the active context to the new one. With this approach, the whole circuit can be reconfigured just by issuing a microprocessor command, and the reconfiguration time would be that of a microprocessor write cycle. In fact, as long as the microprocessor can reconfigure any single cell of the FPGA, a set of cells rather than the whole chip can be reconfigured "on the fly." Furthermore, the data inside the FFs is also duplicated, and can also be read and written by the microprocessor while the application is running. When the context is swapped, the status of the FFs can be maintained or stored with the rest of the context. This makes it possible to initialise the FFs in the non-active context before setting it as active, and also to save the values of the circuit nodes when changing the context.

This technique has been christened as hardware swap, and it makes it possible to efficiently work with virtual hardware. Non-active contexts hold their configuration and data just like virtual memory is stored into a swap archive in a computer system. A hardware swap takes place when the virtual hardware is mapped back onto the actual hardware resources, just like the information inside the swap archive is restored onto the actual memory of a computer when required again. Moreover, an analogy can be established between virtual hardware and software procedures: global variables in software procedures can be likened to data in the FFs which is kept after hardware swap, and procedure parameters can be compared to data in the FFs which are saved and restored during the hardware swap.

Figure 4:
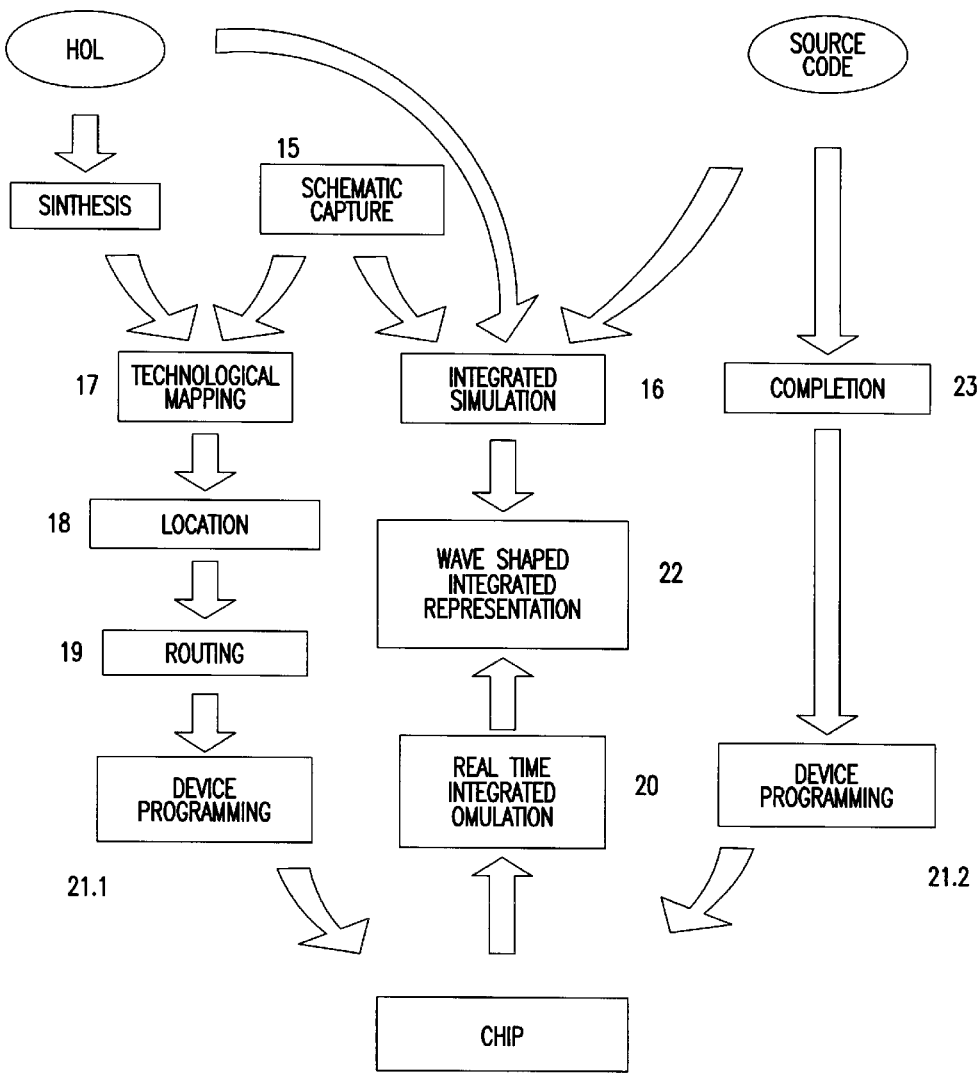
FIG. 4 summarizes the proposed CAD flow for the integrated methodology.

An overview of the design flow is shown in FIG. 4. This diagram is in fact simplified to avoid cluttering.

There are some features not highlighted on it such as back-annotation after placement and routing to give feedback to simulation, the interaction between the emulation stage and the schematic capture for example.

The key innovative point of this design flow is that it follows an integrated methodology. This entails integrated design specification, simulation, emulation, waveform display, technology mapping (with placement and routing) and device programming.

The user can interface the system at nearly any point of the design flow. For example, he could specify the design with HDL before the synthesis or at gate level before the technology mapping or instancing DMCs just before the placement or even try a manual placement or routing.

The emulation box 20 allows for the emulation of the microprocessor program including step by step execution, breakpoints, etc., and probing of the internal points of the analog or digital architecture. This way, the user can trace the program and, at the same time, see the current values of actual nodes of the circuit.

An integrated waveform display 22 is provided to understand how the entire system is interacting at a given moment in run time or simulation time. It includes an analog waveform display (in fact, when emulation is used this is quite like a digital oscilloscope), a digital waveform display (this is like a logic analyser) and a code execution window (where one can trace the program, set breakpoints, etc.).

A wide range of applications have been considered to be mappable onto the FIPSOC chip using the FIPSOC CAD design flow. The typical system to be developed, implemented and prototype with the FIPSOC environment is composed of a core microprocessor which runs some user programs, digital hardware for high speed or control purposes, and an analog front-end for data acquisition or analog output. As an example, two applications are currently being developed to show how the FIPSOC system can be used in an industrial design and prototyping environment.

An example application is an integrated coin recognizer and vending machines controller system. This system includes a microprocessor that controls digital and analog hardware (optical, magnetic and extensiometric sensors to measure coin dimensions, weight and conductivity, serial communication interfaces implementing standard protocols, etc.). The microprocessor also carries out some processing work to calculate the coin speed and acceleration, credit accounting and selling prices control, sold products and cash control, etc. Real time emulation can be useful in this application to calibrate the sensing processes, testing the digital hardware, etc.

A great number of applications based on dynamic reconfiguration could also be identified and implemented with the FIPSOC digital hardware. These include communication switches, parallel processing applications such as image processing, array-based applications, medical electronics and ultrasonics etc.

We claim:

1. A microprocessor-based, mixed-signal field programmable integrated circuit on a chip, comprising:

an array of digital programmable cells, and a programmable routing architecture that is configurable to interconnect said array of digital programmable cells in a predetermined manner, and a set of programmable digital pads for input/output communication to the outside of the chip;

a set of analog programmable cells for signal conditioning, acquisition and generation, and a set of programmable analog pads for communication to the outside of the chip; and a microprocessor used to a) configure the digital and analog programmable cells, the routing architecture, the digital pads, and the analog pads through write operations, and used to b) probe in real time the status of the analog signals through an analog-to-digital converter and the status of the digital signals through normal memory access of the user application, and used to c) run general purpose computational and control programs specified by a user and also to control the set of programmable digital pads.

2. The microprocessor-based, mixed-signal field programmable integrated circuit on a chip according to claim 1, wherein the digital programmable cells include four flip-flops and four LUTs.

3. The microprocessor-based, mixed-signal field programmable integrated circuit on a chip according to claim 1, including a double memory cell to backup each configuration feature of the system in order to provide a multi-context dynamic reconfiguration capability.

4. A hardware-software co-emulation methodology on a single programmable piece of silicon, comprising the integration of:

all necessary first CAD tools for the design of general purpose digital applications on a field programmable digital circuit, the first CAD tools including schematic capture, technology mapping, placement, routing, and device programming;

all second CAD tools for the design of analog and mixed signal applications including signal conditioning, acquisition and output generation, the second CAD tools including schematic capture, technology mapping, placement routing, and device programming;

all necessary software tools for the design of applications on a microprocessor;

an integrated framework for the communication and combined operation of the first CAD tools, the second CAD tools and the software tools in such a way that they share their data and provide a consistent and integrated methodology; and an integrated hardware-software co-emulator capable of measuring in real time the state of internal signals, using an internal on-chip microprocessor, and also providing software emulation capabilities.

* * * * *

UNITED STATES PATENT AND TRADEMARK OFFICE
CERTIFICATE OF CORRECTION

PATENT NO.   : 6,460,172 B1                                                                Page 1 of 1
DATED        : October 1, 2002
INVENTOR(S)  : Insenser Farre et al.

It is certified that error appears in the above-identified patent and that said Letters Patent is hereby corrected as shown below:

<u>Title page,</u>
Please insert -- [30]     Foreign Application Priority Data     PCT/ES96/00253 filed December 30, 1996 --
Please insert under [30] Foreign Application Priority Data: -- Spain P 9602168 filed October 10, 1996 --
Please insert -- [63] Related U.S. Application Data Continuation-in-part of application No. 09/091,168, filed on October 1, 1998, now abandoned --

<u>Column 1,</u>
Line 5, please insert -- This application is a continuation-in-part of application No. 09/091,168, filed on October 1, 1998, now abandoned. --

Signed and Sealed this

Fifth Day of August, 2003

JAMES E. ROGAN
*Director of the United States Patent and Trademark Office*